United States Patent
Roach et al.

(10) Patent No.: US 10,755,060 B2
(45) Date of Patent: Aug. 25, 2020

(54) SECURITY FEATURE USING PRINTED LEDS AND WAVELENGTH CONVERSION MATERIAL

(71) Applicant: Nthdegree Technologies Worldwide Inc., Tempe, AZ (US)

(72) Inventors: Steven B. Roach, Gilbert, AZ (US); Richard A. Blanchard, Los Altos, CA (US); Eric Kahrs, Phoenix, AZ (US); Larry Todd Biggs, Queen Creek, AZ (US); Chye Kiat Ang, Singapore (SG); Mark D. Lowenthal, Vancouver, WA (US); William J. Ray, Fountain Hills, AZ (US)

(73) Assignee: NTHDEGREE TECHNOLOGIES WORLDWIDE INC., Tempe, AZ (US)

( * ) Notice: Subject to any disclaimer, the term of this patent is extended or adjusted under 35 U.S.C. 154(b) by 45 days.

(21) Appl. No.: 16/007,103

(22) Filed: Jun. 13, 2018

(65) Prior Publication Data
US 2018/0357455 A1    Dec. 13, 2018

Related U.S. Application Data

(60) Provisional application No. 62/518,862, filed on Jun. 13, 2017, provisional application No. 62/547,017, (Continued)

(51) Int. Cl.
*G06K 7/10* (2006.01)
*H01L 25/075* (2006.01)
(Continued)

(52) U.S. Cl.
CPC ....... *G06K 7/10564* (2013.01); *G06K 19/047* (2013.01); *G06K 19/0708* (2013.01);
(Continued)

(58) Field of Classification Search
USPC ......................................... 235/494
See application file for complete search history.

(56) References Cited

U.S. PATENT DOCUMENTS

| 5,881,196 A | 3/1999 | Phillips |
| 7,077,329 B2 * | 7/2006 | Chang ................... B41M 3/144 |
| | | 235/491 |

(Continued)

OTHER PUBLICATIONS

PCT/US2019/035453, USPTO as ISA, "International Search Report and Written Opinion," 9 pages.
(Continued)

*Primary Examiner* — Rafferty D Kelly
(74) *Attorney, Agent, or Firm* — Patent Law Group; Brian D. Ogonowsky

(57) ABSTRACT

In one embodiment, a printed security mark comprises a random arrangement of printed LEDs and a wavelength conversion layer. During fabrication of the mark, the LEDs are energized, and the resulting dot pattern is converted into a unique digital first code and stored in a database. The emitted spectrum vs. intensity and persistence of the wavelength conversion layer is also encoded in the first code. The mark may be on a credit card, casino chip, banknote, passport, etc. to be authenticated. For authenticating the mark, the LEDs are energized and the dot pattern, spectrum vs. intensity, and persistence are converted into a code and compared to the first code stored in the database. If there is a match, the mark is authenticated.

26 Claims, 10 Drawing Sheets

Related U.S. Application Data filed on Aug. 17, 2017, provisional application No. 62/551,197, filed on Aug. 28, 2017, provisional application No. 62/556,935, filed on Sep. 11, 2017.

(51) Int. Cl.
  *H01L 33/50* (2010.01)
  *G06K 19/04* (2006.01)
  *G06K 19/07* (2006.01)
  *H01L 33/54* (2010.01)
  *H01L 33/38* (2010.01)
  *H01L 33/62* (2010.01)
  *H02J 5/00* (2016.01)
  *H04B 5/00* (2006.01)
  *H02J 50/10* (2016.01)

(52) U.S. Cl.
  CPC ...... *G06K 19/0723* (2013.01); *H01L 25/0753* (2013.01); *H01L 33/505* (2013.01); *H01L 33/508* (2013.01); *H01L 33/38* (2013.01); *H01L 33/50* (2013.01); *H01L 33/54* (2013.01); *H01L 33/62* (2013.01); *H02J 5/005* (2013.01); *H02J 50/10* (2016.02); *H04B 5/0037* (2013.01); *H04B 5/0075* (2013.01)

(56) References Cited

U.S. PATENT DOCUMENTS

| | | |
|---|---|---|
| 9,443,180 B2 | 9/2016 | Lowenthal |
| 2003/0047610 A1* | 3/2003 | Selinfreund ........... G11B 23/28 235/454 |
| 2008/0214312 A1* | 9/2008 | Richard .................... G07F 1/06 463/47 |
| 2009/0174766 A1* | 7/2009 | Kiyomizu ................ G06K 9/00 348/77 |
| 2013/0224071 A1* | 8/2013 | Bernstein ................ A61L 2/081 422/24 |
| 2014/0355298 A1 | 12/2014 | Meis et al. |
| 2015/0248603 A1* | 9/2015 | Lowenthal ....... G06K 19/06112 235/375 |
| 2017/0191934 A1 | 7/2017 | Lawandy |
| 2017/0231043 A1 | 8/2017 | Kluge |

OTHER PUBLICATIONS

PCT/US2019/035456 USPTO as ISA, "International Search Report and Written Opinion," 8 pages.

* cited by examiner

SECURITY FEATURE USING PRINTED LEDS AND WAVELENGTH CONVERSION MATERIAL

CROSS-REFERENCE TO RELATED APPLICATIONS

This application is based on U.S. provisional application Ser. Nos. 62/518,862, filed Jun. 13, 2017; 62/547,017, filed Aug. 17, 2017; 62/551,197, filed Aug. 28, 2017; and 62/556,935, filed Sep. 11, 2017, all assigned to the present assignee and incorporated herein by reference.

FIELD OF THE INVENTION

This invention relates to authentication tools using light emitting particles for authenticating articles and, in particular, to a security mark containing printed light emitting particles such as light emitting diodes (LEDs), phosphors, or quantum dots, and combinations thereof.

BACKGROUND

U.S. Pat. No. 9,443,180 is assigned to the present assignee and incorporated herein by reference. That patent discloses details of methods to print microscopic LEDs on a security label or directly on an object to be authenticated, where the LEDs are naturally randomly arranged within the security mark, such as within a 1 $cm^2$ area. For example, there may be 30-50 LEDs within the security mark, and each security mark is inherently different. The LEDs are illuminated and the random pattern is stored in a database. Phosphor particles may instead be printed and illuminated with UV or a blue light. The security label is then attached to an object to be later authenticated. Any type of visible serial number or other object identifier may be paired with the stored random pattern in the security mark. For authentication, such as at the point of sale, the light emitting particles (LEDs or phosphor) are illuminated and the detected pattern is communicated to the database, such as via the Internet. If there is a match between the detected pattern and the previously stored pattern, the object is deemed to be authenticated. Some items mentioned that may be authenticated include bank notes, passports, high value products, and credit cards.

It is desirable to expand on the general concept of basing authentication on printed light emitting particles in order to provide security or to provide additional features that make use of the light emitting particles.

SUMMARY

Various improvements and alternatives to the basic technology described in U.S. Pat. No. 9,443,180 are described.

In one new application, a credit card includes an induction coil that supplies a pulse of power to LEDs in a security mark on the card to illuminate the LEDs. Alternatively, a voltage directly applied to the standard smart card chip in the card is routed to the LEDs to illuminate the LEDs. The random arrangement of LEDs not only authenticates the card, but the light is distributed within the card using light guide technology to illuminate any logos or to otherwise show that the card contains the new feature. Therefore, there is synergy in using the authentication device for an additional feature.

A similar technology may be applied to poker chips or other valuable objects.

To add a secondary degree of security, or even provide the only level of security, the LEDs are coated with a wavelength conversion material, such as phosphor, a dye, or quantum dots, prior to printing, or a wavelength conversion layer is provided in the security mark. The wavelength conversion material absorbs some of the relatively short wavelength primary light and emits longer wavelength secondary light having any spectrum vs. intensity pattern. These materials may be designed to have a certain spectrum vs. intensity, or certain absorption wavelengths, or certain persistences that make it very difficult to reproduce or easily detect. These optical characteristics may be made very complex by mixing different wavelength conversion and absorbing materials. Such optical characteristics may be stored in a database and then later detected at the point of sale and compared to the stored characteristics. If there is a match, the object is deemed to be authenticated. In such a case, LEDs are not necessary if the wavelength conversion material can be energized by an external blue or UV light source. The random pattern of the particles may provide the primary level of authentication, or the randomness may not even be relevant to authentication.

Other enhancements of the concepts described in U.S. Pat. No. 9,443,180 are also described.

BRIEF DESCRIPTION OF THE DRAWINGS

Elements that are similar or identical in the various figures are labeled with the same numeral.

DETAILED DESCRIPTION

Figure 1:
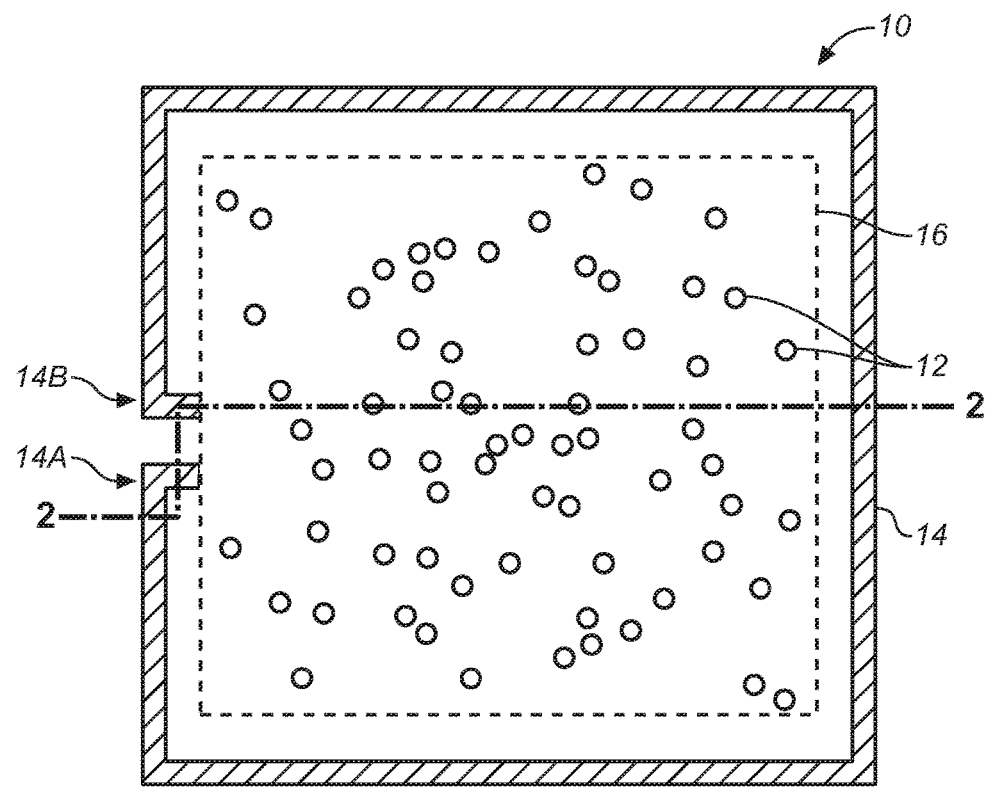
FIG. 1 is a top down view of a printed security label showing a random array of printed LEDs and an inductive loop for powering the LEDs. A wavelength conversion layer, having distinguishing characteristics for authentication, may be provided over the LEDs.

FIG. 1 is a top down view of a printed security label 10 showing a random array of printed LEDs 12 and a metal inductor loop 14 for powering the LEDs 12. Each LED 12 may be coated with a phosphor, dye, or quantum dots having customized characteristics, or a layer of phosphor, dye, or quantum dots (or a mixture) may overlie or underlie the LEDs 12.

The perimeter of the printed LED layer (i.e., where the LED ink is printed) is shown by the dashed line 16. The label 10 may actually represent the printed material on any substrate, including the article itself to be authenticated, such as a passport, license, credit card, etc. The label 10 may be smaller than a postage stamp (e.g., less than 1 square inch) and have an adhesive backing. The label 10 may be made as a sheet or roll in a high speed roll-to-roll process and singulated. The cost per label 10 may be on the order of a penny. The label 10 is very flexible.

Depending on the drive technique used and the amount of power that must be delivered to adequately light all the LEDs 12 in the lamp, the inductor loop 14 may be printed as a flat spiral or rectangular coil of two or more turns to form a secondary coil in order to efficiently couple with a primary drive coil producing an oscillating magnetic field. For two or more turns, the innermost loop connects to a first lamp electrode (e.g., an anode) and an additional insulating layer must be printed over the coil loops so that an electrical trace connecting the end of the outermost winding of the spiral coil may cross over the inner loops of the coil and make electrical contact with a second lamp electrode (e.g., a cathode) to complete the lamp-coil circuit. The coil may instead be supplied separately and electrically connected to the LED electrodes.

Alternatively, the LED layer may be powered by directly probing the anode and cathode terminals with a voltage, such as done when powering a smart card chip in credit card readers.

Figure 2:
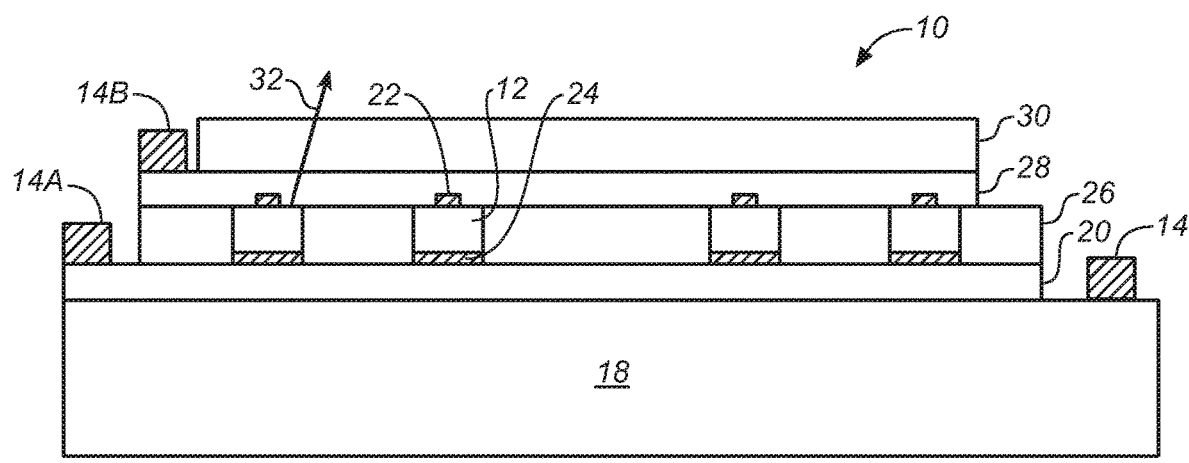
FIG. 2 is a cross-section of the security label of FIG. 1 along line 2-2 in FIG. 1, showing only a few of the LEDs, whose relative sizes have been greatly enlarged. A wavelength conversion layer is provided over the LEDs.

FIG. 2 is a simplified cross-section of the security label 10 of FIG. 1 along line 2-2 in FIG. 1, showing only a few of the LEDs 12, whose relative sizes have been greatly enlarged for illustration.

The label 10 may be formed as follows.

In FIG. 2, a starting substrate 18 may be polycarbonate, PET (polyester), PMMA, Mylar or other type of polymer sheet, or even a thin metal film, paper, cloth, or other material. In one embodiment, the substrate 18 is about 12-250 microns thick and may include a release film.

A conductor layer 20 is then deposited over the substrate 18, such as by printing. The substrate 18 and conductor layer 20 may be essentially transparent. For example, the conductor layer 20 may be ITO or a sintered silver nano-wire mesh. If light is to be emitted in the direction opposite to the substrate 18, the substrate 18 or conductor layer 20 may be reflective.

A monolayer of microscopic inorganic LEDs 12 is then printed over the conductor layer 20. The LEDs 12 are vertical LEDs and include standard semiconductor GaN layers, including an n-layer, and active layer, and a p-layer. GaN LEDs typically emit blue light. The LEDs 12, however, when used with a phosphor, dye, or quantum dots, may instead emit UV light.

The GaN-based micro-LEDs 12 are less than a third the diameter of a human hair and less than a tenth as high, rendering them essentially invisible to the naked eye when the LEDs 12 are spread across the substrate 18 to be illuminated. This attribute permits construction of a nearly or partially transparent light-generating layer made with micro-LEDs. In one embodiment, the LEDs 12 have a diameter less than 50 microns and a height less than 20 microns. The number of micro-LED devices per unit area may be freely adjusted when applying the micro-LEDs to the substrate 18. The LEDs 12 may be printed as an ink using screen printing or other forms of printing. Further detail of forming a light source by printing microscopic vertical LEDs, and controlling their orientation on a substrate, can be found in US application publication US 2012/0164796, entitled, Method of Manufacturing a Printable Composition of Liquid or Gel Suspension of Diodes, assigned to the present assignee and incorporated herein by reference.

In one embodiment, an LED wafer, containing many thousands of vertical LEDs, is fabricated so that the top metal electrode 22 for each LED 12 is small to allow light to exit the top surface of the LEDs 12. The bottom metal electrode 24 is reflective (a mirror) and should have a reflectivity of over 90% for visible light. Alternatively, the bottom electrode may be made to be partially or fully transparent to allow light to be emitted in comparable amounts both upwards away from the substrate and downwards through the substrate 18. With either the solid bottom reflector electrode or the transparent bottom electrode option, there is also some side light, depending on the thickness of the LED. In the example, the anode electrode is on top and the cathode electrode is on the bottom.

Further detail on fabrication of microscopic LEDs and the printing of the LEDs to form a security label is described in U.S. Pat. No. 9,443,180.

The LED ink is then printed over the conductor layer 20. The orientation of the LEDs 12 can be controlled by providing a relatively tall top electrode 22 (e.g., the anode electrode), so that the top electrode 22 orients upward by taking the fluid path of least resistance through the solvent after printing. The anode and cathode surfaces may be opposite to those shown. The pattern of the LEDs 12 is random, but the approximate number of LEDs 12 printed per label 10 can be controlled by the density of LEDs 12 in the ink. The LED ink is heated (cured) to evaporate the solvent. After curing, the LEDs 12 remain attached to the underlying conductor layer 20 with a small amount of residual resin that was dissolved in the LED ink as a viscosity modifier. The adhesive properties of the resin and the decrease in volume of resin underneath the LEDs 12 during curing press the bottom cathode electrode 24 against the underlying conductor layer 20, creating a good electrical connection. Over 90% like orientation has been achieved, although satisfactory performance may be achieved with only 50% of the LEDs being in the desired orientation for a DC driven lamp design. 50% up and 50% down is optimal for lamps that are powered with AC, such as those driven through inductive coupling using the conductive loop powered lamp as seen in FIG. 1.

A transparent polymer dielectric layer 26 is then selectively printed over the conductor layer 20 to encapsulate the sides of the LEDs 12 and further secure them in position. The ink used to form the dielectric layer 26 pulls back from the upper surface of the LEDs 12, or de-wets from the top of the LEDs 12, during curing to expose the top electrodes 22. If any dielectric remains over the LEDs 12, a blanket etch step may be performed to expose the top electrodes 22.

To produce a transparent lamp or a lamp that emits upward and away from the substrate 18, conductor layer 28 may be a transparent conductor such as silver nano-wires, which is printed to contact the top electrodes 22. The conductor layer 28 is cured by lamps to create good electrical contact to the electrodes 22.

The LEDs 12 in the monolayer, within a defined area, are connected in parallel by the conductor layers 20/28. Since the LEDs 12 are connected in parallel, the driving voltage will be approximately equal to the voltage drop of a single LED 12.

A wavelength conversion layer 30 may be printed over the transparent conductor layer 28. Alternatively, the wavelength conversion material may be deposited on the LEDs 12 prior to infusing the LEDs 12 in the solution. Still further, the wavelength conversion layer may be below the LEDs 12, where the bottom conductor layer 20 can be a transparent conductor.

Any metal pattern may then be printed for coupling an external power source to the conductor layers 20/28.

When the LEDs 12 are energized by a voltage potential across the conductor layers 20/28, very small and bright blue dots are created. A blue light ray 32 is shown. Some of the blue light may pass through the wavelength conversion layer 30 and add to the overall color emitted by the wavelength conversion layer 30. Alternatively, all LED light may be absorbed by the wavelength conversion layer 30 and converted to secondary light of a longer wavelength. Any emitted frequency spectrum can be customized.

The particular characteristics of the light emitted by the wavelength conversion layer 30 can be customized to provide a primary or secondary security criterion, as described in more detail later. For example, the wavelength conversion layer 30 may be customized for light persistence, wavelength vs. intensity spectrum, or other characteristic, and combinations of characteristics. When the emitted characteristics are combined with the random locations of the LEDs 12, a two-level security system is created that is virtually impossible to replicate.

For ease in energizing the LEDs 12, current through the metal inductor loop 14 is generated by inductive coupling. The inductor loop 14 may be formed by printing a metal pattern contacting the conductor layers 20/28. FIG. 2 shows a cross-section of the inductor loop end portion 14A contacting a small extension of the conductor layer 20, and another cross-section (taken at a different location) of the inductor loop end portion 14B contacting a small extension of the conductor layer 28. A majority of the inductor loop 14 is formed on the dielectric substrate 18, and a somewhat vertical conductive trace connects the inductor loop 14 to the upper end portion 14B. Each step in the vertical stair-step like rise between the portions 14A and 14B is typically less than 10 µm and so is easily traversed by a printed trace of either an opaque reflective conductive ink or a partially or substantially transparent conductive ink. A sufficient current induced in the inductor loop 14 in the proper direction will forward bias the LEDs 12 to illuminate them. A suitable value resistor may also be printed between the inductor loop 14 and the conductor layers 20/28 to limit current.

As previously mentioned, a direct probe of the anode and cathode electrodes connected to the conductor layers may also be used to energize the LEDs 12. If power is not available, the wavelength conversion layer 30 or the phosphor, dye, or quantum dots directly on each LED 12 may be energized by a blue or UV external light to determine the locations of the dots and the characteristics of the wavelength conversion material.

The bottom of the substrate 18 may be coated with an adhesive for affixing to an article to be authenticated. Alternatively, the substrate 18 may be a surface of the object to be authenticated.

The label 10 is very flexible and has a thickness on the order of paper or cloth, such as between 5-13 mils.

The labels 10 may be formed using a roll-to-roll process where the LEDs 12 and other layers are continuously printed on a single substrate 18 and then singulated. One surface of the labels may have a tacky adhesive applied to them, and the labels may then be applied to a wax film for creating inexpensive rolls of many labels 10. Since the positions of LEDs 12 for each label 10 are random when printed, the pattern of LEDs in each label 10 will be different and unique.

In addition to printing the LEDs 12, a black ink code, such as a machine readable serial number, bar code, or quick response (QR) code may optionally also be printed on a non-light emitting portion surface of the label 10 to provide a secondary degree of security. The substrate 18, LED layer, and conductor layers are substantially transparent so the black ink code may even be printed below the LED layer. This black ink code may identify the batch of labels 10 or may uniquely identify the label 10. The black ink code may even be printed directly on the article to be authenticated rather on the label 10. The latter option allows the user of the label to define the association of a given black in code on the article being securely identified with the label 10 placed on that article. The producer of the label 10 will then be guaranteed to have no knowledge of valid pairings of black ink security codes and secure LED labels 10 in order to produce an enhanced level of security. Instead of using black ink, any other color ink may be used. The ink may even be magnetic, or an invisible fluorescent ink, or a color changing ink.

During the roll-to-roll manufacturing of the labels 10, the LEDs 12 in each label 10 are energized by an inductive coil or a direct coupling to a voltage, and an optical imager (a camera), synchronized with the energization, takes a picture of the dot pattern (e.g., blue dots) and detects the characteristics of the energized wavelength conversion material. A digital code is then generated based on the dot pattern and characteristics of the wavelength conversion material. For example, the processing system in the detector may divide the picture into a grid of small cells (e.g., 10×10 cells, 10×13 cells, etc.) and generate a code that reflects which cells contain one or more dots. The dot code may also be associated with the machine-readable black ink code on the label 10. The dot code and black ink code for each label 10 are then stored in a secure database that is accessible via the Internet or other communication system.

Figure 3:
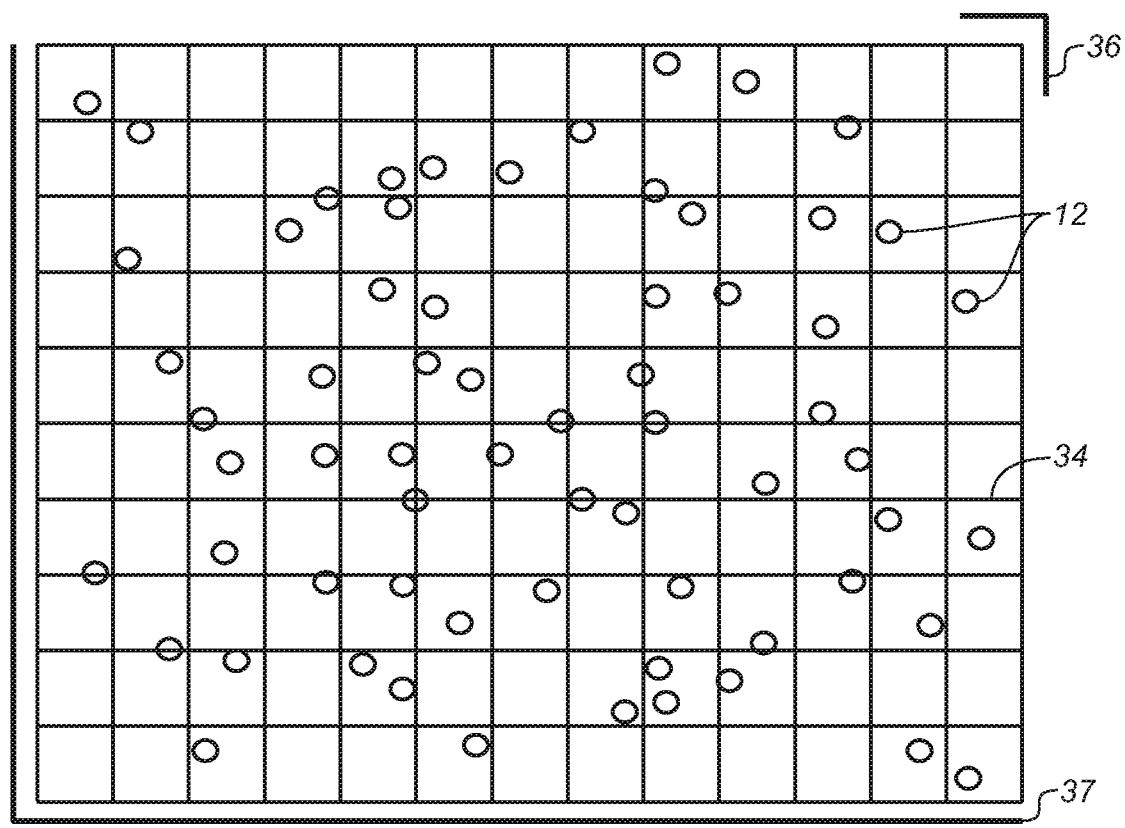
FIG. 3 illustrates a virtual 10×13 grid, less than 1 square inch, superimposed over a random pattern of 65 printed microscopic LEDs, which may be the LEDs in FIG. 2, along with printed orientation marks used when detecting the pattern of LEDs.

FIG. 3 illustrates the superimposed grid 34 on a security label along with alignment markings 36 and 37 on the security label.

The labels 10 are then applied by the user to the articles to be authenticated. Alternatively, the various layers may be directly printed on the articles, such as bank notes, certificates, passports, prescription drug labels, licenses, credit cards, debit cards, poker chips, etc.

When someone desires to later authenticate the article, the following devices and methods may be used.

Figure 4:
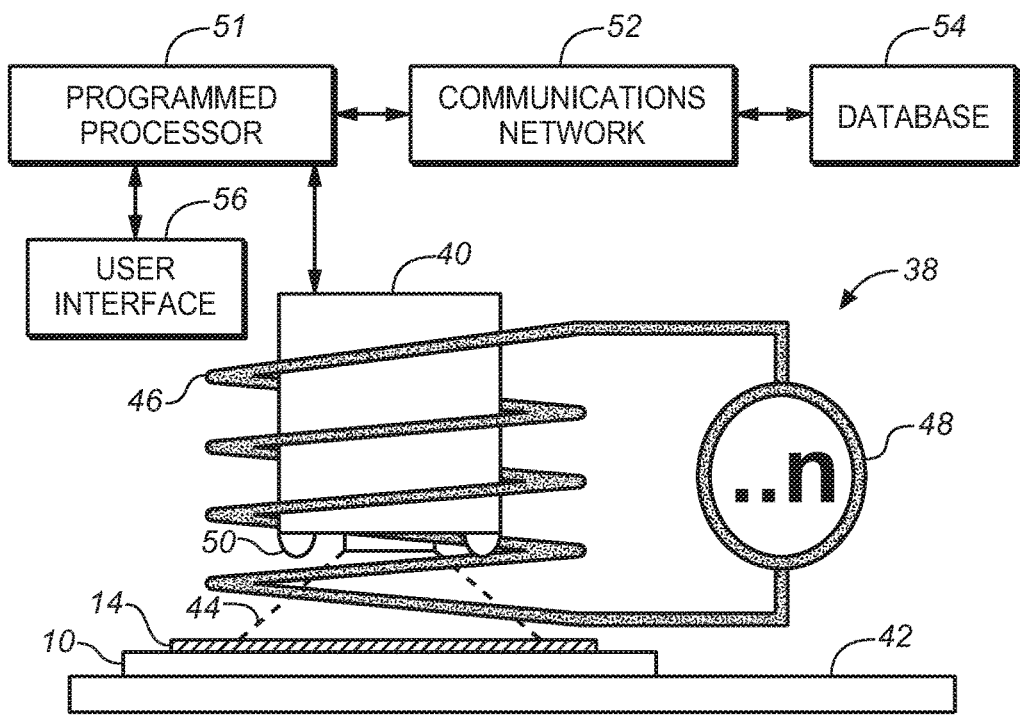
FIG. 4 illustrates a detector for inductively powering the LEDs in the security label of FIG. 1, optically detecting the light pattern and wavelength conversion material characteristics, and communicating with a remote secure database for authenticating the label. The detector may additionally include a UV source for energizing phosphor, a dye, or quantum dots.

FIG. 4 illustrates one embodiment of a detector 38 that powers the LEDs 12 and authenticates the label 10.

The label 10, or article having the printed layers, is positioned in front of a digital imager 40, such as a camera. If the label 10 is in a credit card, a card reader would be equipped with the detector 38.

The imager 40 may be hand held. The same type of detector 38 may also be used during manufacturing of the label 10 to store the unique code conveyed by the dot pattern and wavelength conversion material. FIG. 4 shows the label 10 supported on a surface 42, which may be the article to be authenticated. The field of view of the imager 40 is shown by the dashed lines 44.

A metal coil 46 (the primary coil) centered over the label 10 is then energized by one or more pulses from a power supply 48 to create an electromagnetic field. An AC signal may also be applied to the coil 46. The electromagnetic field induces a current through the inductor loop 14 on the label and forward biases the LEDs 12 to continuously or briefly illuminate them.

Power may be transferred using either an RF field produced by continuous AC power to the coil 46 or pulsed, using a flyback drive approach. Driving the coil 46 with continuous AC, with a frequency from 10 kHz to 100's of kHz, will light LEDs of both orientations, with one population of LEDs lit during each half of the AC cycle, and a blue dot pattern will coincide with the locations of every printed LED 12. Alternatively, low duty-cycle square wave pulses, with a frequency from 10 KHz to 100's of kHz, may be used to induce a current in the inductor loop 14 with a voltage high enough to light LEDs of one orientation each time the current is supplied to the coil 46. If the inductor loop 14 is printed such that it has a high enough series resistance, the induced voltage signal then damps out to below the micro-LED turn-on voltage of the LEDs as the voltage in the coil 46 and loop 14 swings to the reverse polarity. This permits the LED driver to selectively light only the "down" or the "up" LEDs so that the digital imager 40 may take an exposure of the lit label 10 that spans multiple driver cycles. The polarity of the pulses in the coil 46 is used to select whether the "up" or "down" LEDs 12 are to be lit. The combined pattern of up and down LEDs may be part of the unique code.

Further details of a technique to energize LEDs using an inductor coil and a driver may be found in U.S. Pat. No. 8,413,359, assigned to the present assignee and incorporated herein by reference.

The LED wafer, prior to singulation to form the microscopic LEDs 12 for printing, may be coated with a phosphor layer, dye, or quantum dot (QD) layer over their emitting surfaces during fabrication. Various semiconductor lithographic techniques may be used to prevent the phosphor layer, dye, or quantum dot layer from coating the top electrode. The phosphor, dye, or QDs are energized by the blue LED light or an external blue or UV source to display a random arrangement of lit dots in the label 10. The phosphor, dye, or QD layer may emit any color light, such as blue, red, green, yellow, white, or any broad spectrum of light having a varying intensity customized for a security function. Some of the LED light may leak through the phosphor, dye, or QD layer to combine with the secondary light. In the event that a power source is not available to energize the LEDs 12 during authentication, or if there is a circuit failure, the detector 38 includes UV light emitters 50 that illuminate the surface of the label 10. The phosphor, dye, or QD lit dots are then detected by the imager 40 to perform the authentication.

Once the random arrangement of dots is illuminated, either by the LEDs 12 or the external light source, a programmed processor/memory system 51 connected to the imager 40 records the image (including the characteristics of the wavelength conversion material) and generates the unique code for the dot pattern and secondary light characteristics in the same manner as the code was generated during the manufacture of the label 10. Any other identifying mark on the label 10, such as a serial number, is also optically detected and associated with the unique code. A printed serial number on the article itself, such as a passport, banknote, license, or certificate, may also be optically detected by the imager 40 and ultimately cross-referenced with the unique code.

The unique code and other optically detected information are then transmitted via a communications network 52 to a secure database 54. The user uses a user interface 56 to control the authentication process and receive the authentication information. The user interface 56 may be a simple button pad with a display.

The database 54 then compares the dot code and wavelength conversion material characteristics code to a stored code and, if there is a match, the label 10 is deemed authentic, along with the associated article. The optically detected label serial number (or other printed code) may also be detected, and both codes are compared with associated codes in the database 54 for additional security. The identification that the label 10 is authentic may be transmitted to a display in the user interface 56, or other systems may be used to register that the label 10 is authentic or not authentic.

Figure 5:
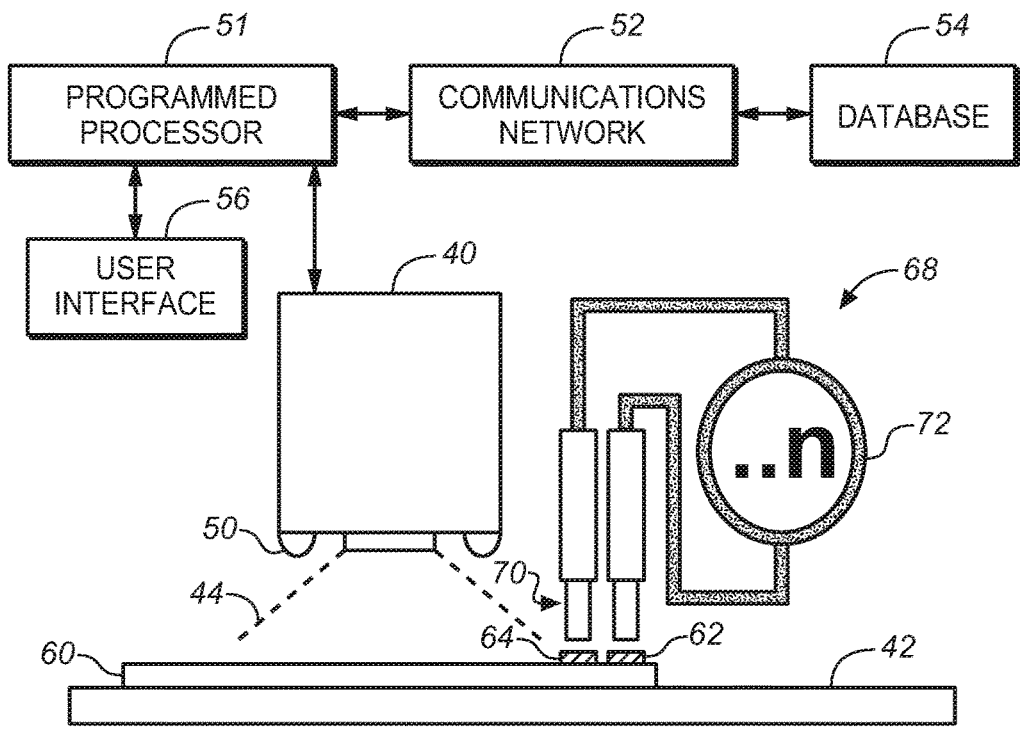
FIG. 5 illustrates a detector for applying power to the LEDs in the security label of FIG. 1, optically detecting the light pattern and wavelength conversion material characteristics, and communicating with a remote secure database for authenticating the label. The detector may additionally include a UV source for energizing phosphor, a dye, or quantum dots.

FIG. 5 illustrates a detector 68 for authenticating the label 60. All elements are the same as the detector 38 of FIG. 4 except for metal probes 70, for applying a voltage to the anode and cathode pads 62/64 on the label, and a polarity switchable DC voltage source 72, which can be used to selectively illuminate LEDs 12 in each orientation. A simple AC voltage source may be used to illuminate both orientations of LEDs 12 without orientation selectability. Such a detector 68 may be located in a credit or debit card reader and also be used to power a smart chip in the card.

The LEDs 12 and conductors/pads may be printed so that the probes can energize selected sections of the label 60. A single common (e.g., grounded) probe may be used, and the various LED sections may be illuminated by one or more positive or negative voltage probes. A metal pad for a section may be printed along an associated side of the label 60.

As previously mentioned, even an external blue or UV light source may energize the wavelength conversion material to detect its customized characteristics to authenticate the object.

In another embodiment, the light-generating devices do not use LEDs, and only phosphor particles, dye, and/or quantum dots are printed in a random arrangement on the substrate. The phosphor, dye, or quantum dot particles may be directly dispersed in an ink at a low concentration so that no substrate is needed. The ink solvent is evaporated, leaving the wavelength-conversion particles randomly scattered on the label surface. No voltage source or conductor layers are needed. The randomness is a natural result of the printing process. An external UV or blue light source energizes the particles instead of using LEDs. The level of security may be less than that when using LEDs but the security may be sufficient for lower value items. In such a case, the dots in FIGS. 1 and 3 represent the wavelength conversion particles rather than LEDs.

Each label, using any of the above described techniques, may contain several dozen micro-LEDs 12 (or other light generating particles or dots) and may be under a square inch in area, for example, as small as 1/64 of a square inch to several square inches in area. The label is affixed to the surface of some article whose authenticity must be verified at a later time. The printed micro-LED lamp labels may be transferred to a target surface using any number of well-known techniques used by industry to transfer labels and apply them to surfaces. For example, the micro-LED lamp security labels may be printed on a continuous or semi-continuous tape to produce a series of lamps along the tape length. The tape may be backed with adhesives and cut to separate the lamps or separated along perforations between the lamps on the tape, or individual lamps on their substrate with adhesive backing may be affixed to a continuous release tape after being cut from the original micro-LED press sheet. The adhesive may be pressure sensitive, heat sensitive, light-activated, or may use some other adhesion activating technique appropriate for the surface to which the label is to be laminated. Alternatively, the substrate or the top protective coating of the lamp itself may be made completely of a low glass transition temperature polymer that can be affixed permanently to a preferably absorbent surface using a heat lamination process that merges the lamp and the target surface.

The adhesive-lamp combination may be constructed in such a manner that removing the tape will destroy the lamp, making it impossible to recreate the original dot pattern. For example, each lamp may be over-coated with a strong contact adhesive, which has greater cohesion with the target object's surface than the interlayer cohesion between at least two active layers within the lamp. Attempting to remove the label from the object to which it has been affixed will split the lamp between active layers, permanently destroying all or some portion of the lamp's lightability.

The labels may also be used to secure containers, where the label is affixed as a seal and must be broken or removed to open the container. A broken label will not light and cannot be repaired. Such a seal may be used for software cases, CD cases, DVD cases, etc. Each unique micro-LED security label lamp in itself is difficult to produce, greater than the difficulty of reproducing a hologram label.

Instead of a label with an adhesive, the LED lamp may be a non-adhesive tag that is secured to the object to be authenticated.

To add an additional layer of security, a hidden "watermark" may be integrated into the micro-LED lamp. Watermarks can be easily created by including a "no-go" area within the printed lamp, where the randomly scattered micro-LEDs 12 will never be printed. A different hidden watermark or set of watermarks may be used for each object class to be securely identified. Such watermarks are described in U.S. Pat. No. 9,443,180.

Many objects that are popular with counterfeiters are possible applications for the type of secure label described above.

Any version of the unique micro-LED lamp label/tag/mark identifier described above or elsewhere in this document may be affixed to an object, or printed directly on the object. The term label and mark are equivalent since each may refer to an affixed stamp or a mark directly printed on the object to be authenticated.

Each micro-LED lamp is fingerprinted either when the micro-LED lamp is initially printed or after it has been affixed to the object to be securely tagged, by imaging the micro-LED lamp while it is lit and recording the image. If UV tagged micro-LEDs are used, the UV illuminated image of the pattern of all the micro-LEDs and the characteristics of the wavelength conversion material in the printed security lamp may also be recorded. The lit-LED image and other characteristics are encoded appropriately into a compact digital format. This lamp fingerprint data is then stored in a secure database with the fingerprint data indexed for searchability. The secure database may then only be blindly queried for "Valid" or "Invalid" responses. At a later time and at a distant location, the energized lamp may be imaged and its encoded image used to query the secure lamp fingerprint database in order to verify the authenticity of the object to which the security lamp is affixed. The micro-LED secure label may be tracked by recording the location each time it is scanned.

FIGS. 6-9 illustrate various techniques and added features when the security system is used with credit cards or debit cards. Such features include using light guides to verify to the user that the LED security label is being energized, and using various powering techniques for energizing the security label.

Figure 6:
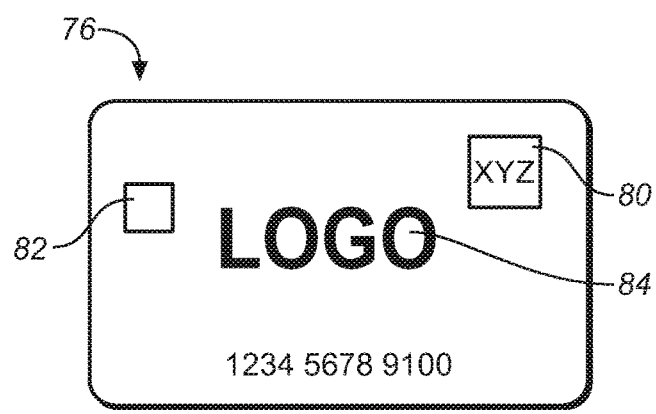
FIG. 6 is a front view of a credit or debit card incorporating a micro-LED security mark as well as light guiding structures for guiding light throughout the card and emitting light through the top and sides of the card.

FIG. 6 is a front view of a credit card 76 containing an LED security label 80 that may be printed directly on the credit card 76 when manufacturing the card 76 using a high speed process. Alternatively, the label 80 is laminated over the card 76 substrate. A conventional smart card chip 82 is also contained in the card 76. The card 76 is typically formed of a plastic, and graphics 84 are printed on the card 76, such as the type of card, the card number, and the owner's name. The graphics layer may instead be a laminated layer.

Figure 7:
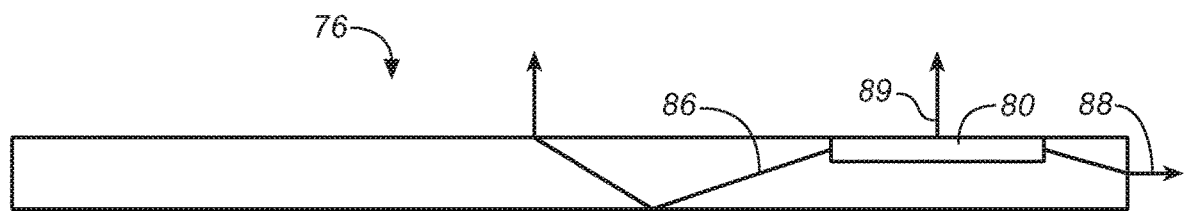
FIG. 7 is a cross-section of the card of FIG. 6 showing side light from the light engine being light-guided by the card.

FIG. 7 is a cross-sectional view of the card 76 of FIG. 6 with features exaggerated for simplicity. The smart chip is not shown. The LED security label 80 generates side light and possibly downward light that is internally reflected within the transparent plastic forming the card's body. A light ray 86 is shown being emitted by the side of the security label 80 and reflected by total internal reflection (TIR) until the light exits a surface of the card. Light extraction features may include molded microscopic prisms, or a roughening of the surface, or printed non-opaque graphics on the card 76. Some or all of the graphics may even be fluorescent so as to glow when energized by the LED light. The light 89 emitted from the top of the security label 80 is also shown.

When the card 76 is inserted into a card reader equipped with one of the detectors described above, the LEDs are powered by either an induction coil or by the voltage contacts used to energize the smart card chip 82. The user sees the card glowing and the edges bright, such as by the light ray 88. The top face of the card 76 also emits light, such as by highlighting any printed graphics. A logo may also be superimposed over the LED security label 80. The image and wavelength conversion characteristics are optically detected, encoded, and transmitted to a database along with any other pertinent information from the card 76. As previously mentioned, the encoded security information is compared to stored security information in the database to determine if there is a match. If so, the credit card 76 is authenticated.

Figure 8:
FIG. 8 is an exploded view of a card body, containing a light engine and smart chip, and a laminated top layer containing graphics.

FIG. 8 illustrates an exploded perspective view of the credit card 76. The top layer 90, containing the graphics, may be a thin transparent layer laminated over the substrate layer 92 for appearance and protection. The security label 80 on the substrate layer 92 is exposed through a window 94 in the top layer 90, and the smart card chip 82 is exposed through another window 96.

An inductor coil 98, printed or laminated on the substrate layer 92, supplies power to the LEDs in the security label 80 when the card 76 is being detected. When the LEDs are energized, the side light optically couples into the substrate 92 and top layer 90 and is waveguided throughout the card 76 until the light exits the top or side surfaces of the card 76. Alternatively, the LEDs may be powered by a DC voltage directly coupled to the Vcc and ground pads of the smart card chip 82, obviating the need for the coil 98. A voltage doubler chip on the substrate layer 92 may be used to convert the Vcc voltage of 1.8 volts to 3.6 volts for powering the LEDs.

The visible feedback to the user not only shows the user that the card 76 has the LED security label feature but is also cosmetically appealing. The side light that is waveguided may be different from the light emitted from the top of the security label 80, since the side light may be mainly the LED primary light, such as blue, while the light emitted from the top of the security label 80 may be a combination of the LED light and the secondary light from the wavelength conversion material, or only light from the wavelength conversion material.

Figure 9:
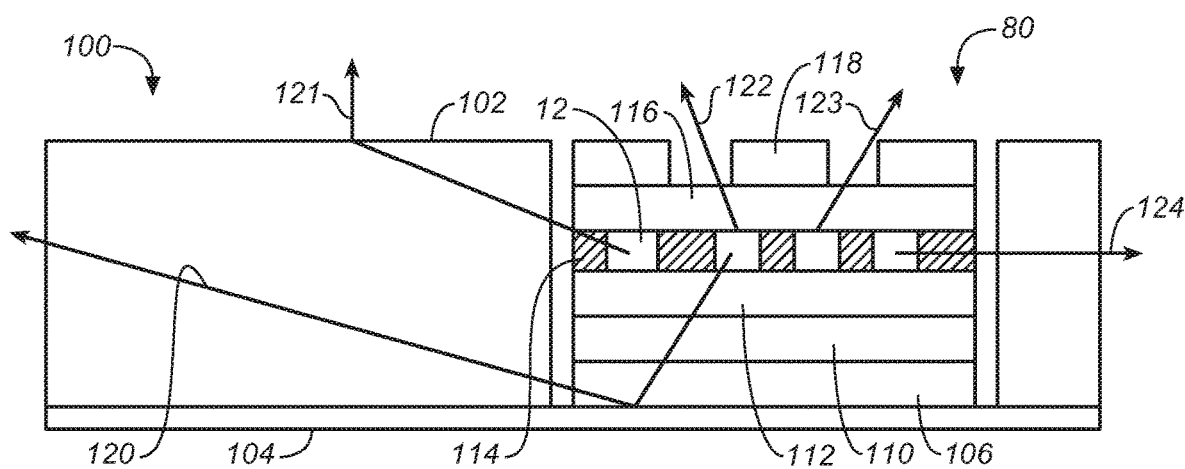
FIG. 9 is a cross-section of a credit card with a light engine showing how side light may be injected into a light guide credit card for being emitted from selected areas of the card. The light engine area is greatly exaggerated with respect to the card area.

FIG. 9 is a simplified and exaggerated cross-sectional view of a credit card 100, showing how the side light from the security label 80 is injected into the body 102 of the credit card 100. In this particular design, the credit card 100 has a bottom reflective layer 104. A transparent light pipe layer 106 may form the bottom layer of the security label 80, or may be part of the card body 102. Over the light pipe layer 106 is formed a customized wavelength conversion layer 110 that has security features, such as a particular persistence, frequency spectrum, etc. Such features may be very complex and not practically reproducible by a counterfeiter. Note that the label area taken up by the LEDs 12 is nominal compared to the open areas, so most of the light emitted by the wavelength conversion layer 110 will be emitted through the front of the label 80.

A transparent conductor layer 112 the then formed, followed by the printing and curing of the LED ink, resulting in the random arrangement of LEDs 12. A transparent dielectric layer 114 fills in the area between the LEDs 12, and a top transparent conductor layer 116 contacts the top electrodes to connect the LEDs 12 in parallel. A graphics layer 118 may be over the label 80.

Light rays 120-124 are shown being emitted in various directions and exiting the top of the label 80 as well as being waveguided by the credit card body 102. Light is also emitted by the wavelength conversion layer 110 in all directions.

Since there is no extra cost in fabricating the credit card 100 to add the waveguiding feature, there is synergy by adding this feature.

FIGS. 10-13 illustrate a similar technique applied to poker chips (casino chips) to not only add authentication but to illuminate the poker chips using waveguiding.

Figure 10:
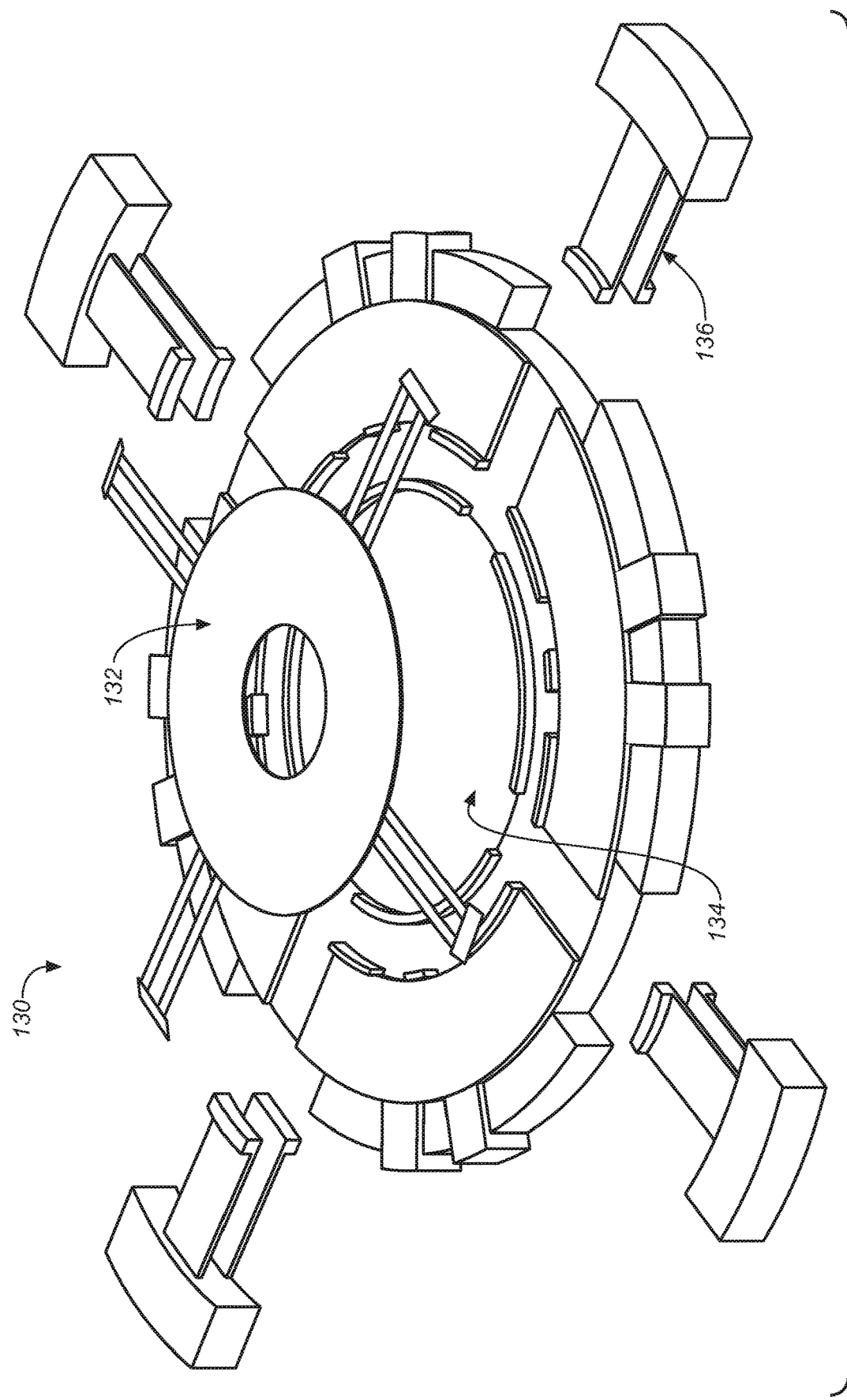
FIG. 10 is an exploded view of a poker chip (a casino chip) containing an induction coil, a light guide, and a micro-LED security mark.

FIG. 10 is an exploded view of a poker chip 130, which may be any casino chip used to make a wager. An inductive coil 132 powers the LED security label 134 formed in the center area. Transparent light guide pieces 136 form part of the periphery of the chip 130 and receive side light from the security label 134. The security label has a random arrangement of LEDs as well as a customized phosphor layer that is very difficult to counterfeit.

Figure 11:
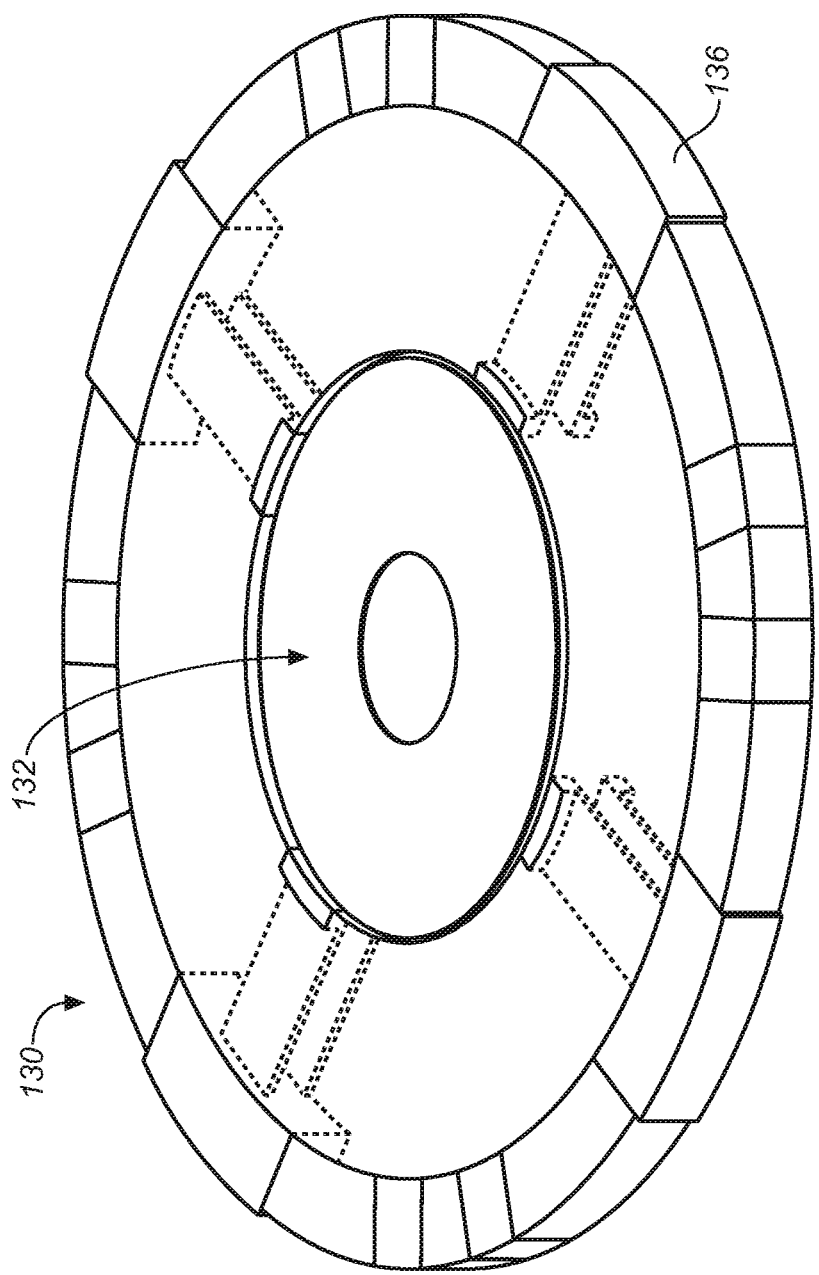
FIG. 11 illustrates the poker chip of FIG. 10 with the elements connected together.

FIG. 11 shows the same chip 130 in a non-exploded view.

Figure 12:
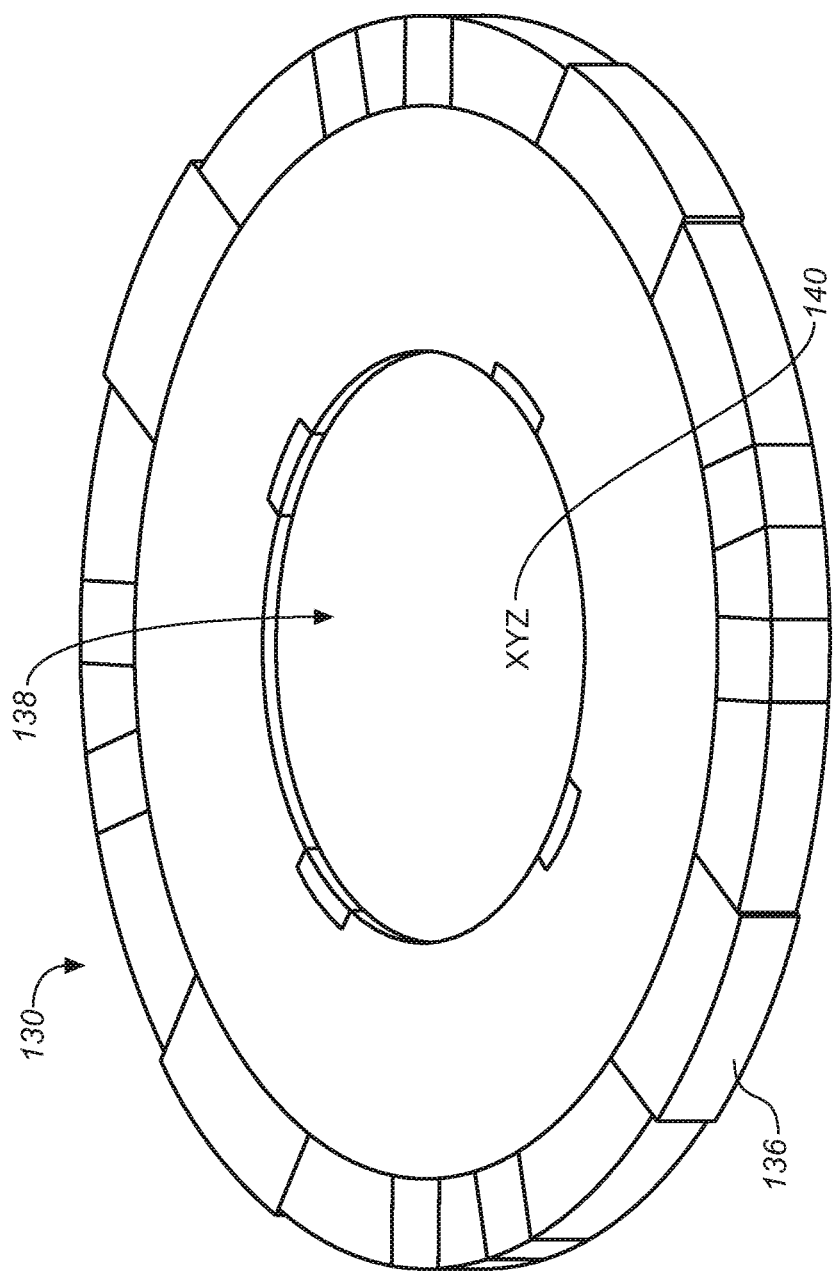
FIG. 12 illustrates the completed poker chip with printed graphics.

FIG. 12 shows the same chip 130 with a thin protective top layer 138. The layer 138 allows light to pass through. The top layer 138 includes graphics 140 to identify the value of the chip 130 and the casino. When the poker chip 130 is authenticated in a magnetic field, the coil 132 energizes the LED security label 134, and the LED pattern as well as the wavelength conversion layer characteristics are optically determined by a camera, then digitized into a code. The code is then compared to a stored code that was obtained during manufacturing of the chip 130 to determine whether or not the chip is authentic. The chip 130 may include any visible code that may also be associated with the security label code. As the security label 134 is being energized, the edges are illuminated at the light guide pieces 136 to verify proper operation of the security label 134.

Figure 13:
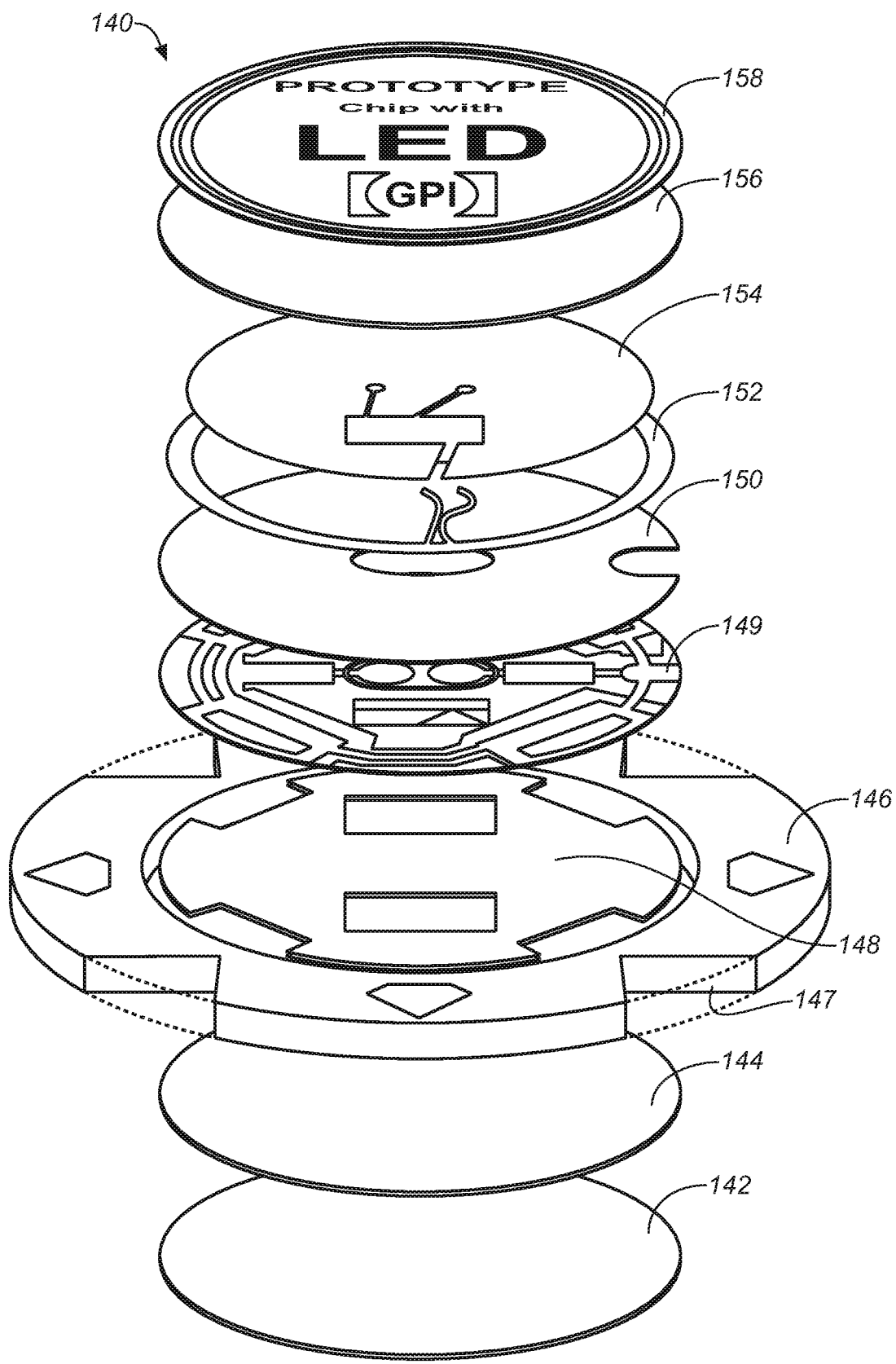
FIG. 13 is an exploded view of another embodiment poker chip using an induction coil, a light guide, and a micro-LED security mark.

FIG. 13 is an exploded view of a poker chip 140 having a different construction. In the chip 140 of FIG. 13, only the characteristics of the phosphor or dye layer over the LED security label provide the security feature, since the top surface of the security label is blocked by an opaque layer. The light from the phosphor or dye layer is emitted at the periphery of the chip 140 using waveguiding within the chip 140. The characteristics of the phosphor or dye layer may be varied from batch to batch for added security.

The phosphor or dye characteristics may also (or only) be used to optically identify the denomination of the chip 140. In such a case, each denomination uses a different phosphor or dye or combination of phosphors or dyes.

The layers are identified from the bottom up in FIG. 13. The bottom layer is a 4-color artwork label 142 showing suitable graphics. A light-blocking double-sided adhesive layer 144 affixes the label 142 to a solid slug 146 that includes a transparent central core for light guiding. The light can escape through transparent/translucent portions 147 near the periphery of the chip. A transparent epoxy layer 148 affixes the LED security label 149 to the slug 146. The security label substrate may include a voltage doubler and rectifier. The security label 149 includes a phosphor, dye, or quantum dot layer whose customized optical characteristics have been stored in a database for authentication. A double-sided adhesive layer 150 affixes an induction coil 152 over the security label 149, which electrically connects to the voltage doubler and rectifier for powering the LEDs. A Mylar spacer 154 is then provided, followed by a double-sided light blocking adhesive layer 156. A 4-color top label 158 is then provided over the central area of the chip 130.

Since the peripheral areas of the chip 140 are exposed, the light from the security label 149 is waveguided in the chip 140 until it exits through the transparent or translucent areas 147. The spectrum of the light emitted from the chip 140 and/or the persistence of the phosphor layer is optically detected by a camera and digitally encoded. The code is then later compared with a stored code in a database to authenticate the chip 140.

FIGS. 14-18 relate to forming a wavelength conversion material having customized characteristics that are very difficult to accurately reproduce. Additionally, the wavelength conversion material may be changed from time to time during the manufacturing process to further enhance security. Characteristics that may be customized include the persistence of the light after the LEDs have turned off, where the persistences of different phosphors in a mixture may be different and associated with different frequency spectrums. The spectrum vs. intensity can be customized, and absorbing materials may form notches in the spectrum vs. intensity graph. Multiple phosphors or dyes may be combined to form a highly complex spectrum vs. intensity graph with different persistences. Other customized characteristics are envisioned.

Figure 14:
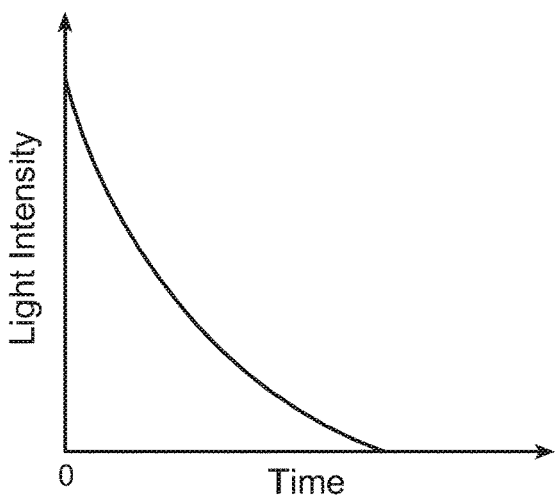
FIG. 14 illustrates the light intensity persistence vs. time of a certain customized phosphor or dye that has been energized with a pulse of blue or UV light at time 0.

FIG. 14 illustrates how, at time 0, the LEDs in the security label are pulsed to energize a single phosphor or dye type. The decay of the light intensity for selected wavelengths is shown. Phosphors and dyes may be customized to have a wide variety of persistences. The phosphor or dye wavelengths and its persistence is the security feature in such an embodiment. The characteristics are stored in a database and then compared with a transmitted code when authenticating the security label.

Figure 15:
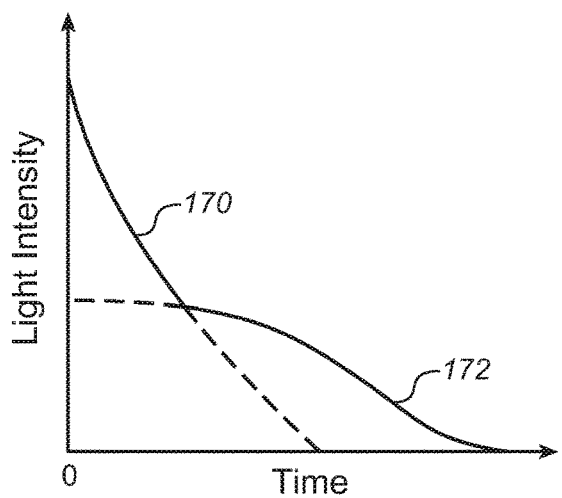
FIG. 15 illustrates the light intensity persistence vs. time of a certain customized phosphor or dye that has been energized with a pulse of blue or UV light at time 0, where the phosphor or dye is composed of two different phosphors or dyes having different persistences, and optionally different wavelength spectrums.

FIG. 15 illustrates how the phosphor or dye light output can become much more complex when combining phosphors or dyes. Only two phosphors or dyes are combined in FIG. 15, but many more phosphors or dyes can be combined with different spectrums and persistences. In the example, the graph 170 may be associated with one type of phosphor or dye, such as one emitting a first spectrum, and the graph 172 may be associated with another type of phosphor or dye emitting a second spectrum or the same spectrum. Both persistences may be independently measured if they apply to different spectrums, which may be filtered to isolate the different phosphors. The relative combinations of two or more phosphors or dyes can be varied over time for high security.

Figure 16:
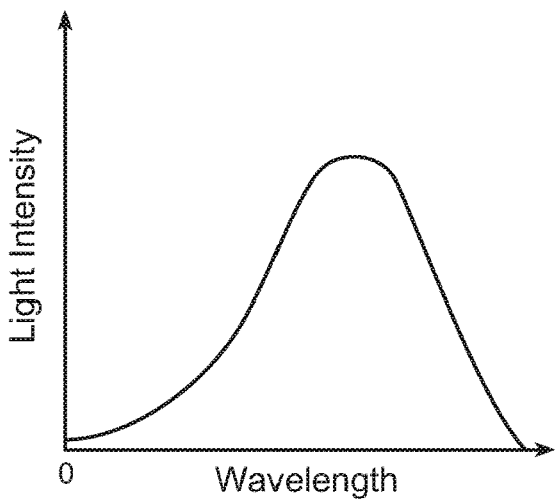
FIG. 16 illustrates the light intensity vs. wavelength of a customized phosphor or dye.

FIG. 16 illustrates how a customized phosphor or dye may have a characteristic emission spectrum, which is the wavelength of the emitted light vs. intensity of light over the spectrum.

Figure 17:
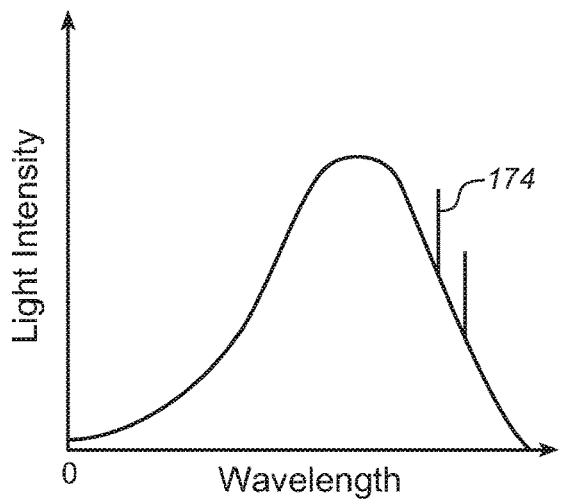
FIG. 17 illustrates the light intensity vs. wavelength of a customized combination of phosphors or dyes.

FIG. 17 shows how multiple phosphors or dyes can be combined to add spikes 174 at various wavelengths or any other perturbation in the graph. The graph may be made very complex by combining phosphors or dyes. Phosphors, dyes, and quantum dots may be combined to further increase the complexity.

Figure 18:
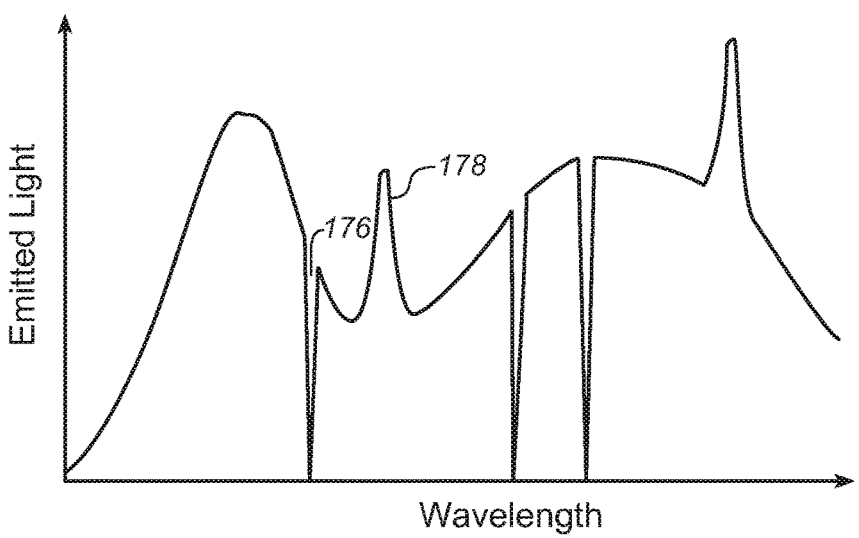
FIG. 18 illustrates a complex light intensity vs. wavelength of a customized combination of phosphors or dyes, where light emission wavelengths and absorption bands are detected for added security.

FIG. 18 illustrates a wavelength vs. intensity graph with multiple phosphors/dyes and wavelength absorbers. The absorbers absorb light at the desired wavelengths and produce the notches 176. The spikes 178 may be associated with other phosphors. A blend of other phosphors or dyes may produce the broad spectrum pattern.

The combination of the spectrum and persistences can provide very high security. In such cases, the specific arrangement of the LEDs in the security label is not relevant.

All features described herein may be combined in various combinations to achieve a desired function.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An authentication system comprising:
   at least one light emitting diode (LED) emitting primary light having a peak first wavelength;
   wavelength conversion material proximate to the at least one LED, the wavelength conversion material emitting secondary light when energized by the primary light, wherein light emitted from a surface of the wavelength material comprises a mixture of the primary light and the secondary light;
   the at least one LED and the wavelength conversion material creating a printed light-emitting pattern within a first area, wherein the printed light-emitting pattern within the first area acts as an authentication tool, the light emitting pattern comprising the mixture of the primary light and the secondary light;
   an optical detector configured for detecting at least a spectrum of light in the mixture of the primary light and the secondary light emitted by the light-emitting pattern, wherein the spectrum has been customized to have a particular spectrum vs. intensity characteristic;
   a processing system coupled to the detector and configured to generate a first code based on the particular spectrum vs. intensity characteristic of the light-emitting pattern, wherein the first code changes based on the particular spectrum vs. intensity characteristic of the light-emitting pattern;
   a communication system coupled to transmit the first code to a database storing pre-stored codes, wherein at least one of the pre-stored codes matches the first code; and
   an interface system configured to convey that the first code matched one of the pre-stored codes, signifying that the authentication tool is authentic.

2. The system of claim 1 wherein the light-emitting pattern comprises a random arrangement of dots, wherein the first code further contains information related to the random arrangement of the dots.

3. The system of claim 2 wherein the at least one LED comprises a random arrangement of printed LEDs, wherein the LEDs are powered for energizing the wavelength conversion material.

4. The system of claim 1 wherein the at least one LED applies a blue or UV light to the wavelength conversion material.

5. The system of claim 1 wherein the wavelength conversion material has a persistence characteristic that is also encoded into the first code.

6. The system of claim 1 wherein the authentication tool is an adhesive label.

7. The system of claim 1 wherein the authentication tool is a tag configured to be attached to an object to be authenticated.

8. The system of claim 1 wherein the authentication tool is formed integral with an object to be authenticated.

9. The system of claim 1 wherein the authentication tool is located within a credit card or debit card for authenticating the credit card or debit card.

10. The system of claim 1 wherein the authentication tool is located within a casino chip used to place wagers.

11. The system of claim 1 wherein light from the light-emitting pattern is light-guided by a light guide, and light exiting the light guide is detected.

12. The system of claim 1 wherein the authentication tool is affixed to an object having a light guide wherein, when the light-emitting pattern is energized, light generated is guided by the light guide and emitted through light exit areas of the light guide.

13. The system of claim 12 wherein the authentication tool is affixed to a credit card or debit card acting as the light guide, wherein light guided by the credit card or debit card is emitted through light exit areas of the credit card or debit card.

14. The system of claim 1 wherein the wavelength conversion material comprises a mixture of phosphors.

15. The system of claim 1 wherein the wavelength conversion material comprises a mixture of phosphors and materials that absorb certain wavelengths of light.

16. An authentication tool comprising:
at least one light emitting diode (LED) emitting primary light having a peak first wavelength;
wavelength conversion material proximate to the at least one LED, the wavelength conversion material emitting secondary light when energized by the primary light, wherein light emitted from a surface of the wavelength material comprises a mixture of the primary light and the secondary light;
the at least one LED and the wavelength conversion material creating a printed light-emitting pattern within a first area, wherein the printed light-emitting pattern within the first area acts as an authentication tool, the light emitting pattern comprising the mixture of the primary light and the secondary light;
wherein, when the wavelength conversion material is energized by the at least one LED, the mixture of the primary light and the secondary light emits a spectrum of light which has been customized to have a particular spectrum vs. intensity characteristic; and
wherein the spectrum vs. intensity characteristic is encoded in a first code that is stored in a database for authenticating the authentication tool at a later time, wherein the first code changes based on the particular spectrum vs. intensity characteristic of the light-emitting pattern.

17. The tool of claim 16 wherein the light-emitting pattern comprises a random arrangement of dots, wherein the first code further contains information related to the random arrangement of the dots.

18. The tool of claim 16 wherein the at least one LED comprises a random arrangement of printed LEDs, wherein the LEDs energize the wavelength conversion material.

19. The tool of claim 16 wherein the wavelength conversion material has a persistence characteristic that is also encoded into the first code.

20. The tool of claim 16 wherein the authentication tool is formed integral with an object to be authenticated.

21. The tool of claim 16 wherein the authentication tool is located within a credit card or debit card for authenticating the credit card or debit card.

22. The tool of claim 16 wherein the authentication tool is located within a casino chip used to place wagers.

23. The tool of claim 16 wherein the authentication tool is affixed to an object having a light guide, wherein when the light-emitting pattern is energized, light generated is guided by the light guide and emitted through light exit areas of the light guide.

24. The tool of claim 16 wherein the wavelength conversion material comprises a mixture of phosphors.

25. The tool of claim 16 wherein the wavelength conversion material comprises a mixture of phosphors and materials that absorb certain wavelengths of light.

26. An authentication tool comprising:
a printed light-emitting pattern within a first area, wherein the printed light-emitting pattern within the first area acts as an authentication tool, the light emitting pattern comprising a wavelength conversion material that converts energizing primary light to secondary light;
wherein, when the wavelength conversion material is energized, the wavelength conversion material emits a spectrum of light which has been customized to have a particular persistence characteristic after the energizing primary light is discontinued;
wherein the wavelength conversion material comprises a plurality of different light emitting materials, where each different material emits a different spectrum and has a different persistence characteristic, such that light emitted by the different materials combines to have a combined spectrum and a combined persistence characteristic; and
wherein the persistence characteristics associated with only one or more pre-selected subsets of the combined spectrum, and not the combined persistence characteristic, are encoded in a first code that is stored in a database for authenticating the authentication tool at a later time.

* * * * *